United States Patent [19]

Masumoto et al.

[11] Patent Number: 5,176,366
[45] Date of Patent: Jan. 5, 1993

[54] RESIN-ENCAPSULATED SEMICONDUCTOR DEVICE PAGKAGE WITH NONCONDUCTIVE TAPE EMBEDDED BETWEEN OUTER LEAD PORTIONS

[75] Inventors: Kenji Masumoto, Hiji; Takashi Nakashima, Beppu, both of Japan

[73] Assignee: Texas Instruments Incorporated, Dallas, Tex.

[21] Appl. No.: 592,717

[22] Filed: Oct. 4, 1990

[30] Foreign Application Priority Data

Oct. 20, 1989 [JP] Japan .................................. 1-274464

[51] Int. Cl.⁵ ...................... H01L 29/44; H01L 23/48; H01L 29/52; H01L 29/60
[52] U.S. Cl. ................................ 357/70; 357/74; 357/72
[58] Field of Search .................. 357/70, 72, 74

[56] References Cited

U.S. PATENT DOCUMENTS 4,916,522 4/1990 Cohn ..................................... 357/72

FOREIGN PATENT DOCUMENTS

| 1516465 | 3/1968 | France | 357/70 |
| 55-78558 | 6/1980 | Japan | 357/70 |
| 60-241242 | 11/1985 | Japan | 357/70 |
| 61-154151 | 7/1986 | Japan | 357/70 |
| 62-123743 | 6/1987 | Japan | 357/72 |
| 63-073547 | 4/1988 | Japan | 357/70 |
| 63-169750 | 7/1988 | Japan | 357/70 |
| 1-36059 | 2/1989 | Japan | 357/70 |
| 1-310571 | 12/1989 | Japan | 357/70 |

Primary Examiner—Andrew J. James
Assistant Examiner—Stephen D. Meies
Attorney, Agent, or Firm—William E. Hiller

[57] ABSTRACT

A semiconductor device in which outer leads adjoining in the direction of arrangement of said outer leads are connected by an insulating material with a predetermined width, locally provided only in the areas with said predetermined width along said direction of arrangement, and in which areas other than said outer leads and said insulating material are resin-sealed. A method for manufacturing a semiconductor device, which has the steps of connecting adjacent outer leads, with an insulating material with a predetermined width locally provided only in areas with said predetermined width along the direction of arrangement of outer leads, and of resin-sealing areas other than said outer leads and said insulating material while preventing the outflow of sealing resin by way of said insulating material.

8 Claims, 11 Drawing Sheets

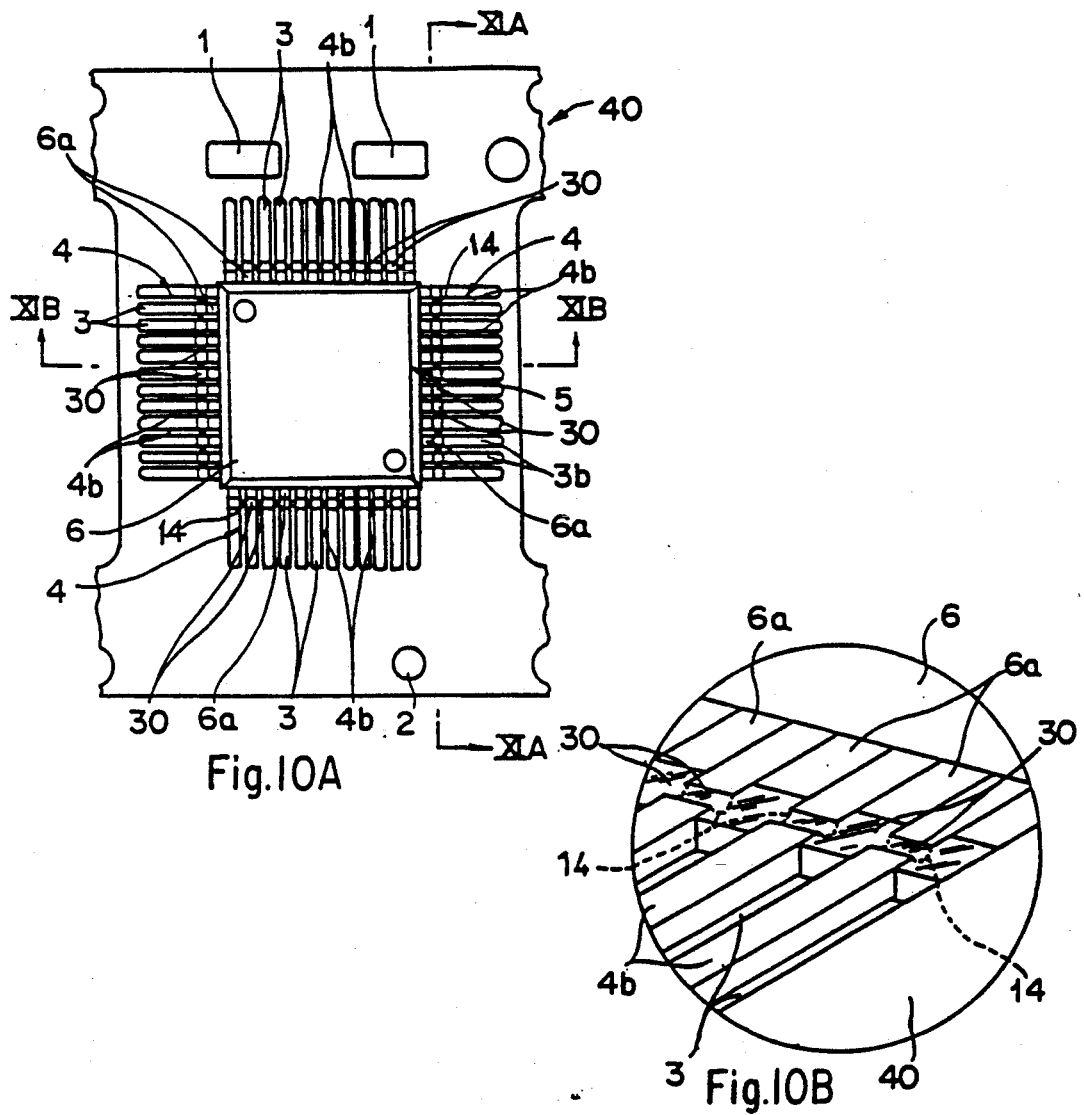

RESIN-ENCAPSULATED SEMICONDUCTOR DEVICE PACKAGE WITH NONCONDUCTIVE TAPE EMBEDDED BETWEEN OUTER LEAD PORTIONS

BACKGROUND OF THE INVENTION

1. Field of the Invention

This invention relates to a semiconductor device and a method for manufacturing the same, and more particularly to a semiconductor device and a method for manufacturing the same which are convenient in resin-sealing.

Description of the Prior Art

As the prior art of semiconductor packaging, thick film technique, thin film technique, resin sealing, bonding, etc. are known.

Then, for example, a semiconductor device using a so-called flat-pack type surface packaging will be described. Intended to increase packaging density on a printed circuit board, this is a type of method which narrows a distance between terminals (outer leads 4b as will be described later) projecting from a mold resin such as epoxy resin and puts out these terminals to the facing sides (or 4 sides) of the mold resin to stick them flatly to the printed circuit board.

An example shown in FIGS. 15 and 16 is a semiconductor device which has a packaging structure called QFP (quad flat package) among the aforementioned flat-pack type ones. FIG. 15 is a plane view of a lead frame showing a state after resin-sealing, and FIG. 16 is a plane view of a lead frame showing a state before resin sealing.

As shown in FIG. 16, the respective leads 4 (11 pieces in each of 4 directions, and totally 44 pieces in this example) provided over a lead frame 40 are composed of inner leads 4a and outer leads 4b. The inner leads 4a are electrically connected with a semiconductor element (for example, an IC chip containing dynamic RAM or the like) 7 mounted on a mount portion 10, by way of a bonding wire (for example, gold wire) 9 fixed to a pad (not shown) on the semiconductor element 7. Moreover, the inner leads 4a and the semiconductor element 7 are, as shown in FIG. 15, formed with a resin (for example, epoxy resin) 6 by way of a transfer mold.

Resin sealing is performed by sandwiching the lead frame 40 between the upper and lower molds of a mold for molding (not shown) to fix it, pouring the resin 6 into a cavity that produces the shape of a package 5, and then hardening said resin 6. However, if there are no dam bars 4c for restricting the outflow of sealing resin as will be described later, the lead frame 40 is, as mentioned above, sandwiched between the upper and lower molds (that is, the lead 4 has a thickness) when the lead frame 40 is fixed to the mold for molding, unavoidably creating spaces 3 between the respective adjacent leads 4. As a result, when the resin 6 poured into the cavity of said mold, the resin 6 poured passes through the spaces 3 between the respective adjacent leads 4 and in turn flows out along the longitudinal direction of said outer leads 4b, thus causing a problem that no satisfactory resin sealing can be performed.

A conventional method commonly used to solve the above-mentioned problem is to provide dams 4c (which are so-called tie bars as shown in FIGS. 15 and 16) for restricting the outflow of mold resin. However, since these dam bars 4c are formed as a part of the lead frame 40 in the predetermined areas of the leads 4 (outer leads 4b), it is necessary after resin-sealing to cut and remove them and thereby separate the adjacent leads 4 (outer leads 4b). In other words, a process of cutting the dam bars 4c is required. And since a special jig is used to cut the dam bars 4c, the outer leads 4b may be given a damage such as unexpected deformation in cutting them. In addition, especially the lead pitch has recently become very narrow, for example, 0.3 mm, and thus made the cutting width of the dam bars 4c less than 0.3 mm, so that working with the aforementioned cutting jig has become very difficult.

Numerals 1 and 2, respectively, in FIGS. 15 and 16 are through-holes, which are to feed the lead frame 40 to each step of packaging process. In addition, 6a shows a resin portion resulting from outflow of the sealing resin 6 to the dam bars 4c and is removed when the above-mentioned dam bars 4c are cut.

Other than the above described method, there is another method of allowing the same effect as the above-mentioned dam bars 4c by providing dams to, for example, a mold for molding. This method is advantageous in that the dam bars 4c do not need to be cut, but if the aforementioned lead pitch becomes less than 0.3 mm, production of its mold becomes extremely difficult or virtually impossible.

OBJECTS AND SUMMARY OF THE INVENTION

The object of this invention is to provide a highly reliable semiconductor device and a method for manufacturing the same, which can eliminate inconvenience in dam bars for preventing the outflow of sealing resin and readily produce a desired lead (outer lead) pitch.

In other words, this invention provides a semiconductor device in which leads having inner leads and outer leads are formed in a predetermined pattern, said outer leads adjoining in the direction of arrangement of said outer leads are connected by an insulating material (particularly resin material) with a predetermined width, locally provided only in areas with said predetermined width, and areas other than said outer leads and said insulating material are resin-sealed.

Furthermore, this invention also provides a method for manufacturing a semiconductor device which comprises the steps of connecting adjacent outer leads, with an insulating material (particularly resin material) with a predetermined width, locally provided only in areas with said predetermined width along the direction of arrangement of said outer leads of leads having inner leads and said outer leads formed in a predetermined pattern, and of resin-sealing areas other than said outer leads and said insulating material while preventing the outflow of sealing resin by said insulating material.

Other objects, features and advantages of the invention will appear more fully from the following detailed description thereof taken in connection with the accompanying drawings.

BRIEF DESCRIPTION OF THE DRAWINGS

FIGS. 1 to 14 show the embodiments of this invention.

FIG. 1 is a plane view showing an example which applies this invention to a flat-pack type semiconductor device.

FIG. 2 is a cross sectional view of a main part along the line II—II in FIG. 1.

FIG. 3 is a plane view of the semiconductor device in FIG. 1 showing a state before resin-sealing.

FIG. 5 is a diagonal view showing one example of semiconductor device in a state with outer leads formed after they are separated from a lead frame in FIG. 1.

FIG. 7 is a cross sectional view of a main part along the line VII—VII in FIG. 6A.

FIG. 8 is a plane view showing a lead frame before an IC chip is mounted on a mount portion.

FIG. 10A is a plane view showing still another embodiment of this invention.

FIG. 10B is an enlarged perspective view of a portion of the semiconductor device shown in FIG. 10A.

FIG. 12 is a plane view showing a lead frame before an IC chip is mounted on a mount portion.

FIG. 15 is a plane view of a semiconductor device with conventional dam bars.

FIG. 16 is a plane view showing a state before resin-sealing in the example of FIG. 15.

DESCRIPTION OF THE PREFERRED EMBODIMENTS

The embodiments of this invention will be hereunder described.

FIGS. 1 to 5 show the first embodiment of this invention, showing an example in which this invention is applied to a flat-pack type semiconductor device having outer leads projecting to the facing sides (in two directions) of mold resin (50 leads on each side, totally 100). However, this example is slightly different in type from that in FIGS. 13 and 14 (specifically, different in the number of pins, size of package, direction of pin projection, etc.) but almost same in basic structure. For the sake of convenience in explanation, some description may be omitted by putting the same numerals.

Figure 1:
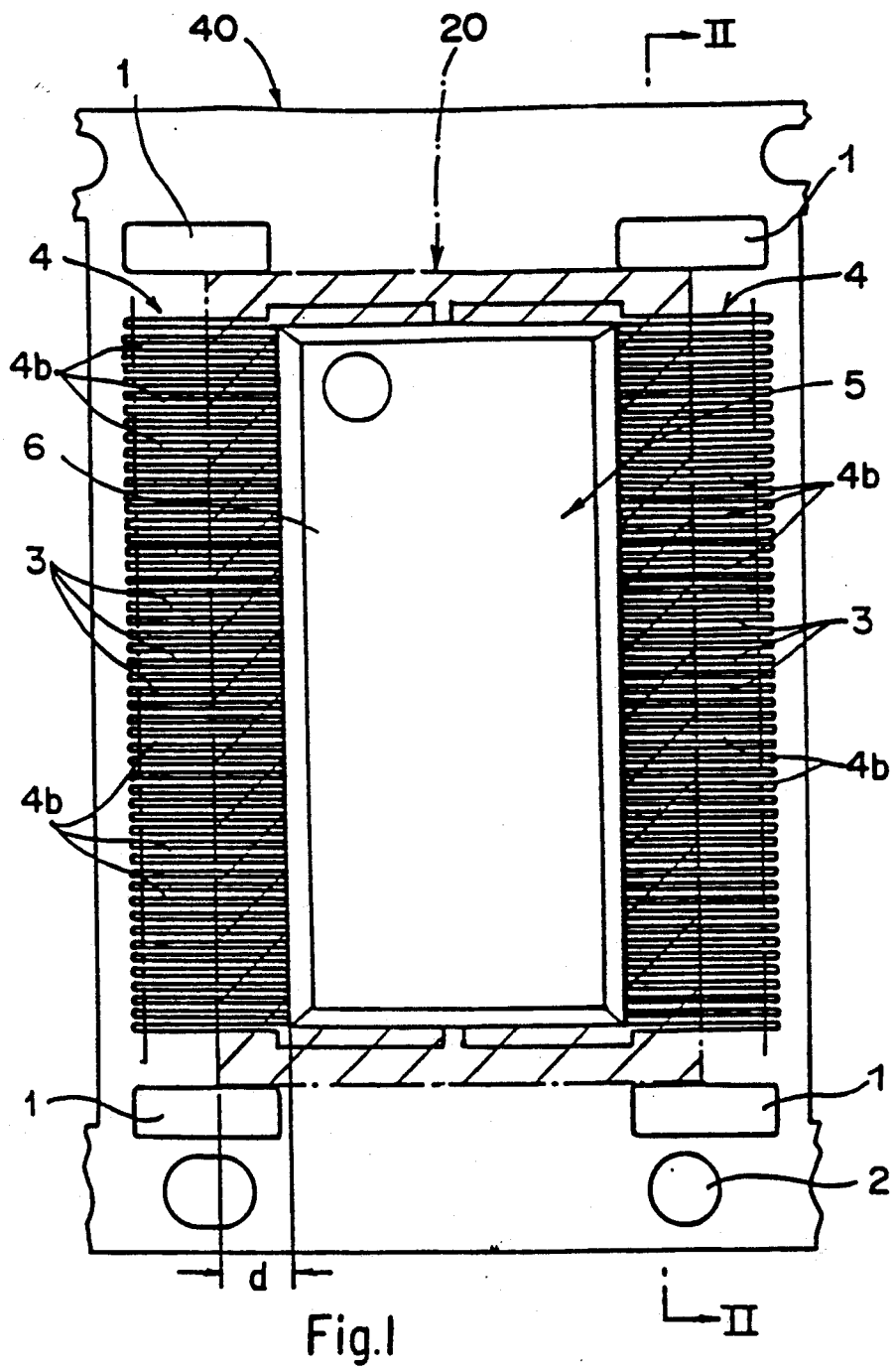
Figure 2:
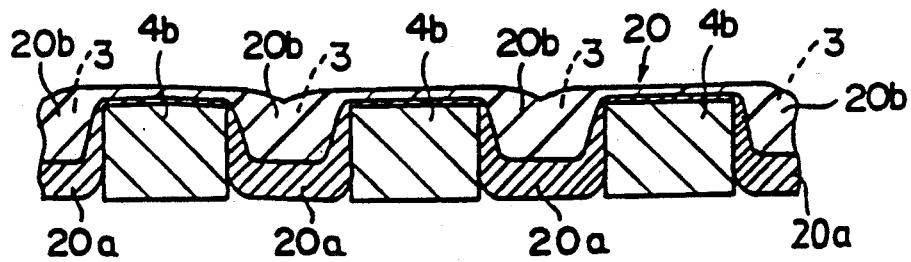

A semiconductor device in accordance with this embodiment has, as shown in FIG. 1, the following markedly different aspects from the above-mentioned prior art: a tape made of resin (which, in this example, has a width d of 1.5 mm with, for example, base film 20b made of polyimide, and is coated with, for example, acrylic resin as an adhesive 20a) 20 is provided in the predetermined areas (a diagonally striped areas within one dot chain lines in the drawing) of outer leads 4b; the respective outer leads 4b are connected in a state that said resin tape 20 is, as in FIG. 2, embedded in spaces 3 between adjacent outer leads 4b: and areas (mold areas) other than the outer leads 4b and the resin tape 20 are sealed with resin 6. Furthermore, this example has no outflow portions 6a of the mold resin 6 like the example in FIGS. 15 and 16.

While a method for manufacturing the aforementioned semiconductor device will be described later, in the semiconductor device in accordance with this embodiment, as described above, the spaces 3 between the outer leads 4b adjoining in the direction of arrangement of the outer leads 4b are connected by the resin tape 20 with a predetermined width for preventing the outflow of sealing resin, locally provided only in areas with said predetermined width along said direction of arrangement. As a result, said resin tape 20 does not need to be cut as in the conventional dam bars which are formed on lead frame, and may be left as it is in the package. This enables to eliminate inconvenience which would be liable to occur when dam bars are cut, and also does not need a jig for cutting dam bars, which is difficult to be prepared, thus leading to cost reduction. Moreover, since the resin tape 20 can be readily formed as a dam for preventing the outflow of sealing resin, only by way of an ordinary process as will be described later, desired lead pitches (with, for example, 0.3 mm or less) can be easily produced. In this example, furthermore, the resin tape 20, which is double-layered with the adhesive 20a and the heat-resisting base film 20b, is used as the aforementioned dam, resulting in its sufficient resistance against heat and pressure in molding.

Figure 5:
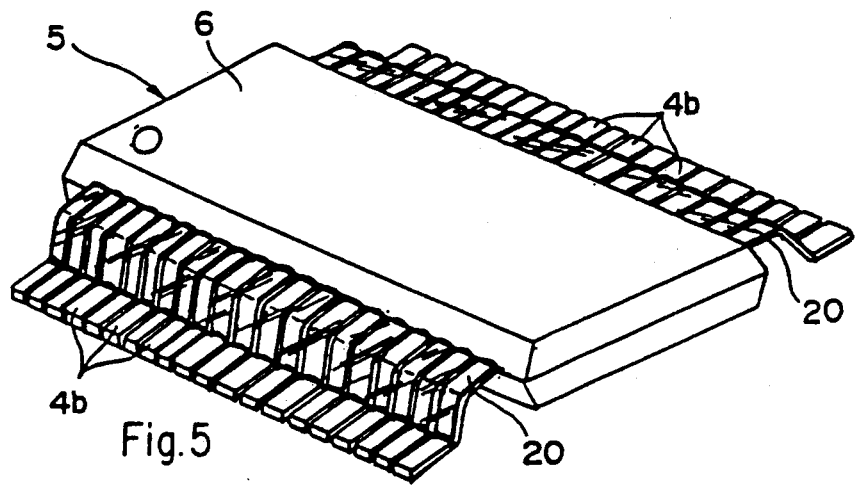

In addition, the electrically insulating property of the resin tape 20 causes no need for concern about contacts of the outer leads 4b with each other, and the spaces 3 between the respective outer leads 4b are held by the resin tape 20. This becomes favorable in that no undesirable deformation is produced when the portions shown by two-dot chain lines in FIG. 1 are separated from the lead frame 40 after molding, followed by formation of the outer leads 4b of the package 5 as shown in FIG. 5.

Figure 3:
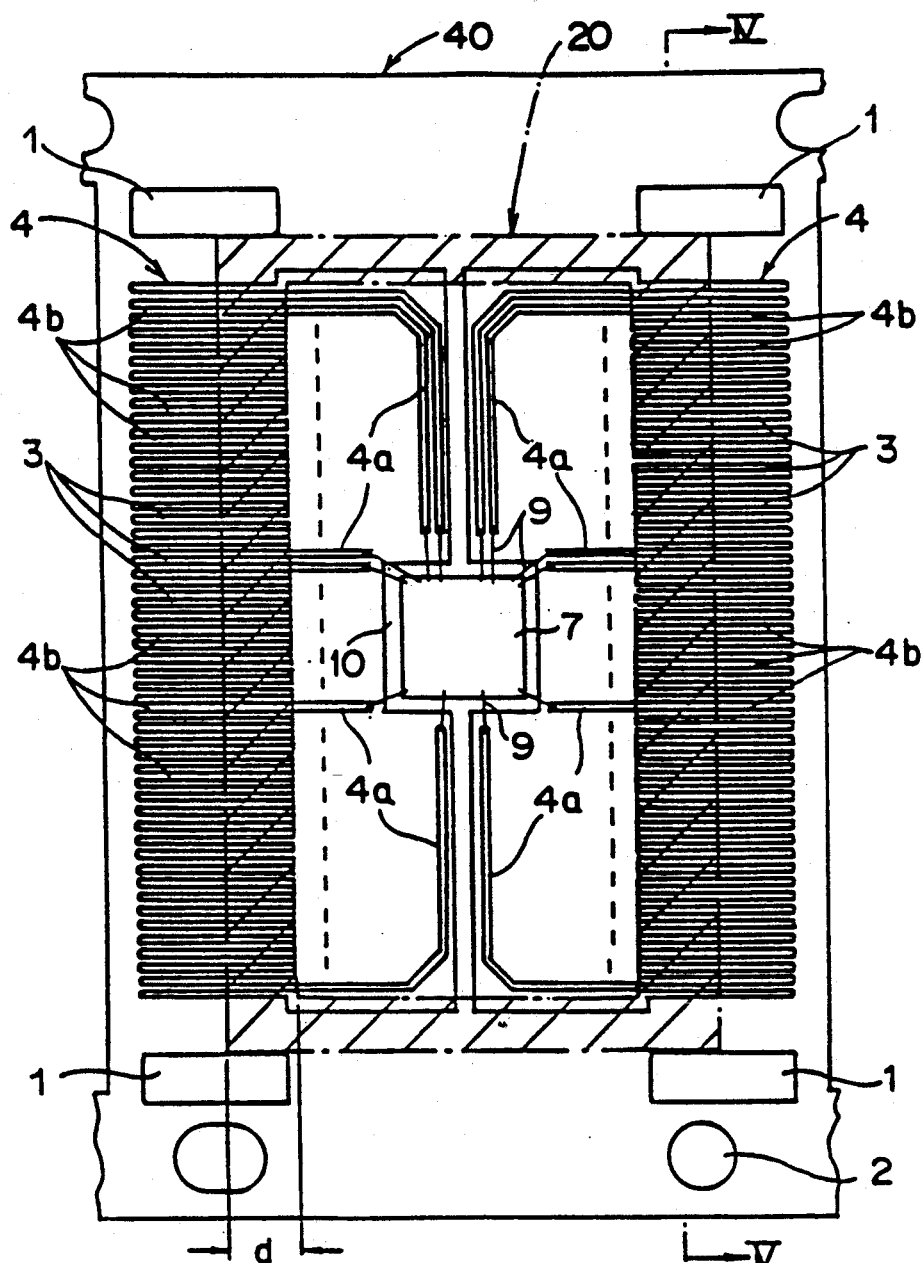

Next, description will be made about a method for manufacturing a semiconductor device in accordance with this embodiment with reference to FIGS. 3 and 4.

First, as described above, with an IC chip 7 mounted on a mount portion 10, wire bonding of inner leads 4a and a pad (not shown) on a chip 7 by wires 9 is all completed. Then, resin tape 20 with the width d of 1.5 mm is sticked on diagonally striped areas inside one dot chain lines in FIG. 3 (see FIG. 4A). The areas having this resin tape sticked thereon are preferably provided so as to slightly invade the mold resin 6 of the package 5 or preferably provided along the mold line. Here in this example, the pitches of the outer leads 4b are set at 0.3 mm, the thickness and width of the outer leads 4b, respectively, at 0.127 mm and 0.15 mm, and the thicknesses of polyimide base film 20b and an adhesive 20a, respectively, in the resin tape 20 are set at 50 μm and 25 μm.

Figure 4A:
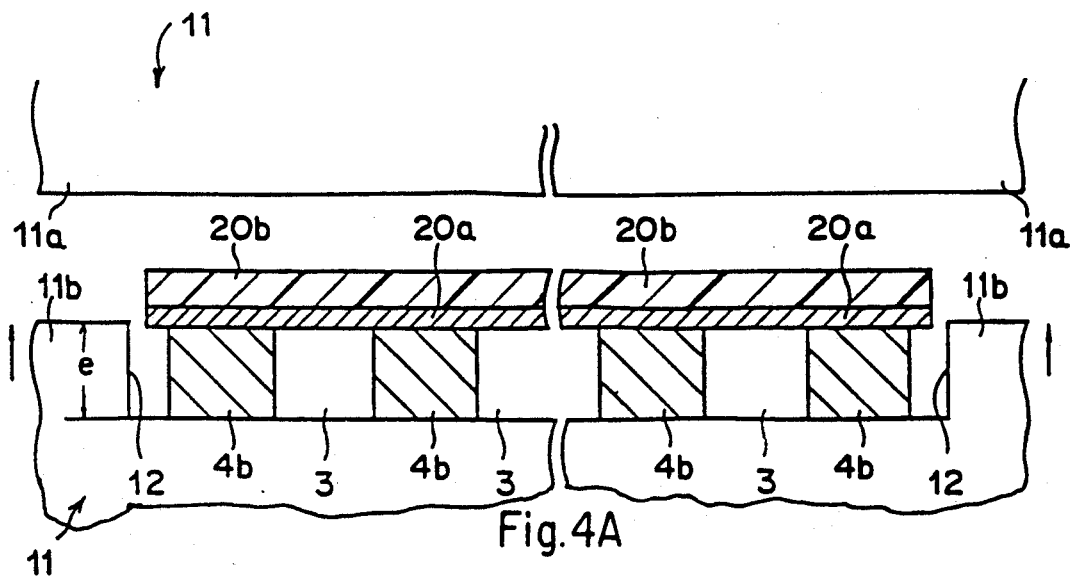
FIGS. 4A and 4B are cross sectional views along the line IV—IV in FIG. 3 showing principal steps of a method for manufacturing the semiconducto device in FIG. 1.
Figure 4B:
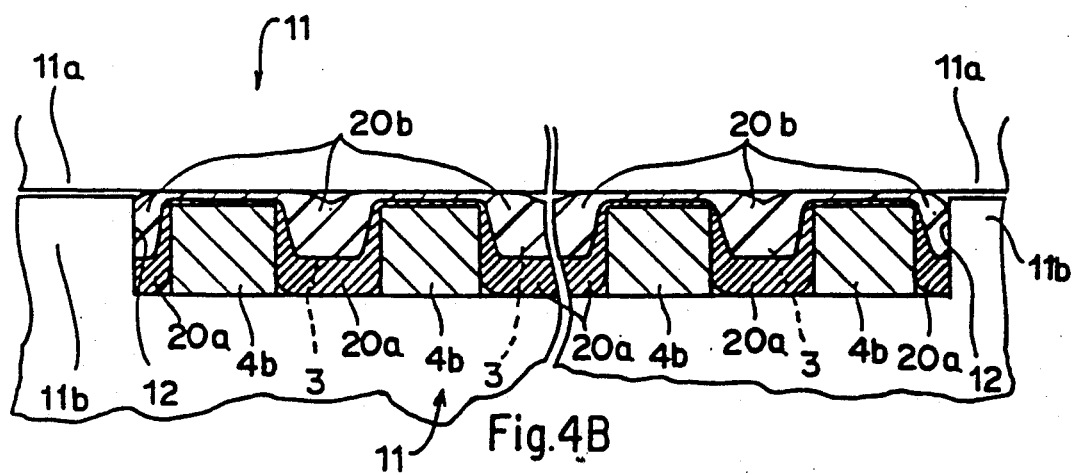

In the next, with the lead frame 40 provided in a predetermined position (a predetermined position of a concave portion 12) of a lower mold 11b of a mold 11 for molding as shown in FIG. 4A, squeezing of the resin tape 20 (with heat at some 180° C. added together with a predetermined pressure at such a time) from above and below by the upper mold 11a and lower mold 11 b of the mold 11 for molding allows, as shown in FIG. 4B, the resin tape 20 to flow to fill up the spaces 3 and then to connect the adjacent outer leads 4b. In such a case the depth e of the concave portion 12 of the lower mold 11b is 0.13 mm, and the thickness of the outer leads 4b is 0.127 mm, so that the difference in level between these two accounts for 0.03 mm. As a consequence, when the resin tape 20 is squeezed from above and below by the mold 11 for molding as shown in FIG. 4B, said difference in level between the lower mold 11b and the outer leads 4b gives a great convenience in connecting the adjacent outer leads 4b with each other by way of the resin tape 20. That is to say, without this difference in level the portions of the resin tape 20 sticked on the outer leads 4b between the adjacent spaces 3 would be too thoroughly squeezed to perform such connections. In case of this example, however, since the resin tape 20 itself maintains the continuous layer because of the above difference, it can effectively resist the pressure of the mold resin at the time of molding.

Although the subsequent steps are not shown here, passing a predetermined process of resin injection leads to completion of the semiconductor device shown in FIG. 1

As clearly seen from the above described method for manufacturing a semiconductor device, the semiconductor device and the method for manufacturing the same in accordance with this embodiment have the following processes: sticking the resin tape 20 on the predetermined areas of the outer leads 4b (in this example, the areas with a width of 1.5 mm extending in the direction from the mold line of the mold resin towards the ends of the outer leads 4b) (see FIGS. 3 and 4A); squeezing the resin tape 20 by the mold 11 for molding so as to connect the spaces 3 between the adjacent outer leads 4b (see FIG. 4B); resin-sealing areas (mold areas) other than the outer leads 4b while preventing the outflow of the sealing resin 6 by way of the resin tape 20. This therefore leads to no need for a cutting process as in case of the conventional dam bars, and also enables highly reliable resin-sealing only by a conventional technique without addition of any special process, so that a semiconductor device having the aforementioned advantages can be readily produced.

Figure 15:
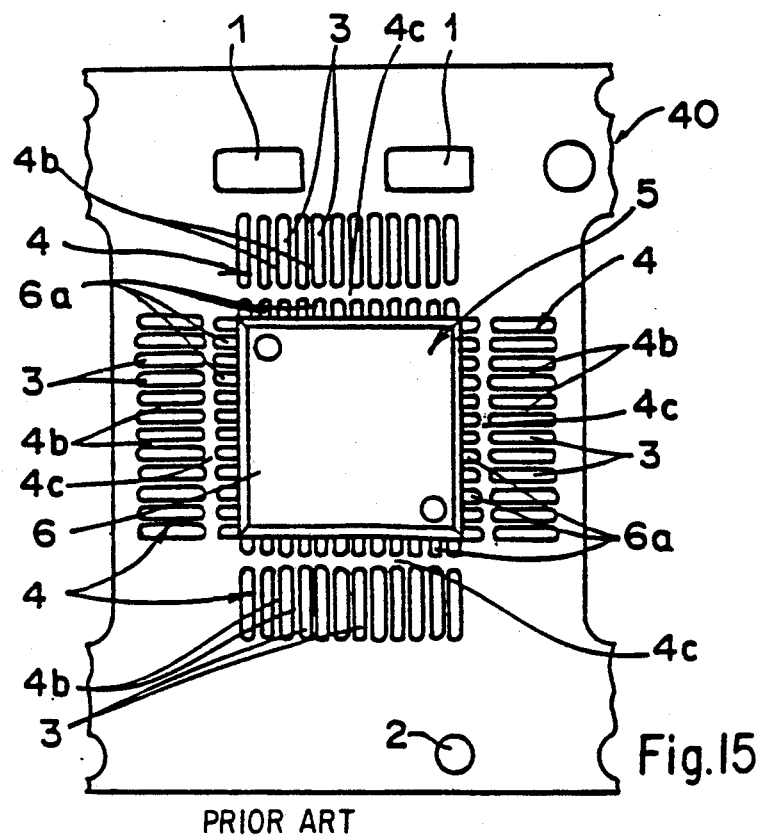
FIGS. 15 and 16 show the prior art.
Figure 16:
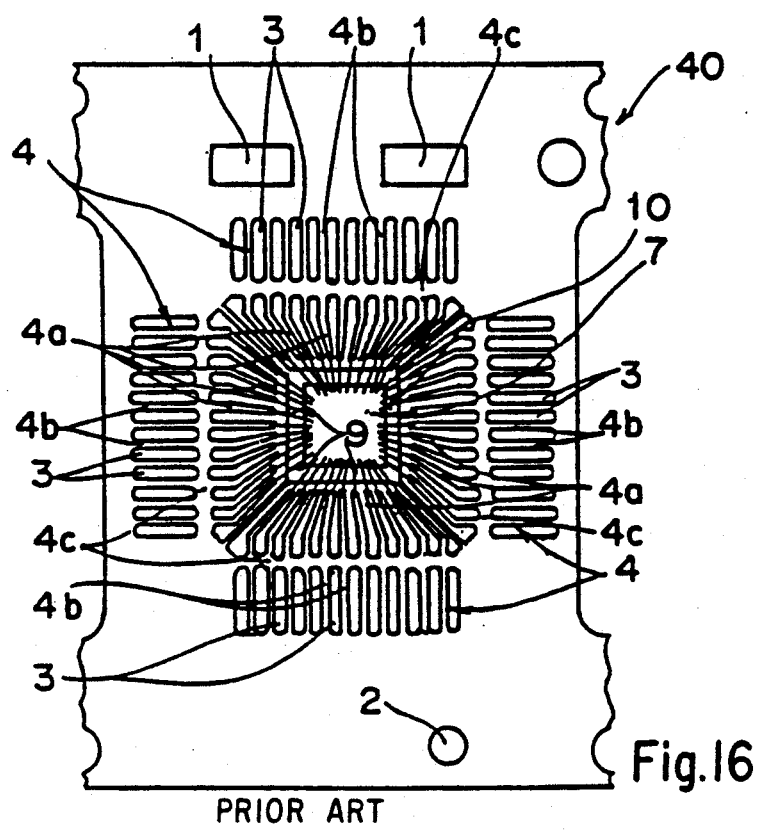

Moreover, since there is no need for cutting dam bars as in case of conventional ones, an area for formation of resin dam bars 20 can be provided, as described above, to the very limit along the mold line, thus making it possible to prevent the formation of the outflow portions 6a of extra mold resin 6 as shown in FIGS. 15 and 16. FIG. 5 is a diagonal view of a semiconductor device in which the outer leads 4b are formed into a so-called gullwing type by separating the package 5 shown in FIG. 1 from the lead frame 40. This flat-pack type package, for example, is flatly mounted on a printed circuit board or the like.

FIGS. 6 to 9 show another embodiment of this invention.

Since the basic structure of a semiconductor device in accordance with this embodiment is approximately same as one in FIGS. 15 and 16, description is omitted by putting the same numerals for the sake of convenience in explaining. But a difference lies in the aspect that resin tie bars 25 are, as shown in FIGS. 6B and 7, formed by using photoresist (dry film as will be described later).

Figure 6A:
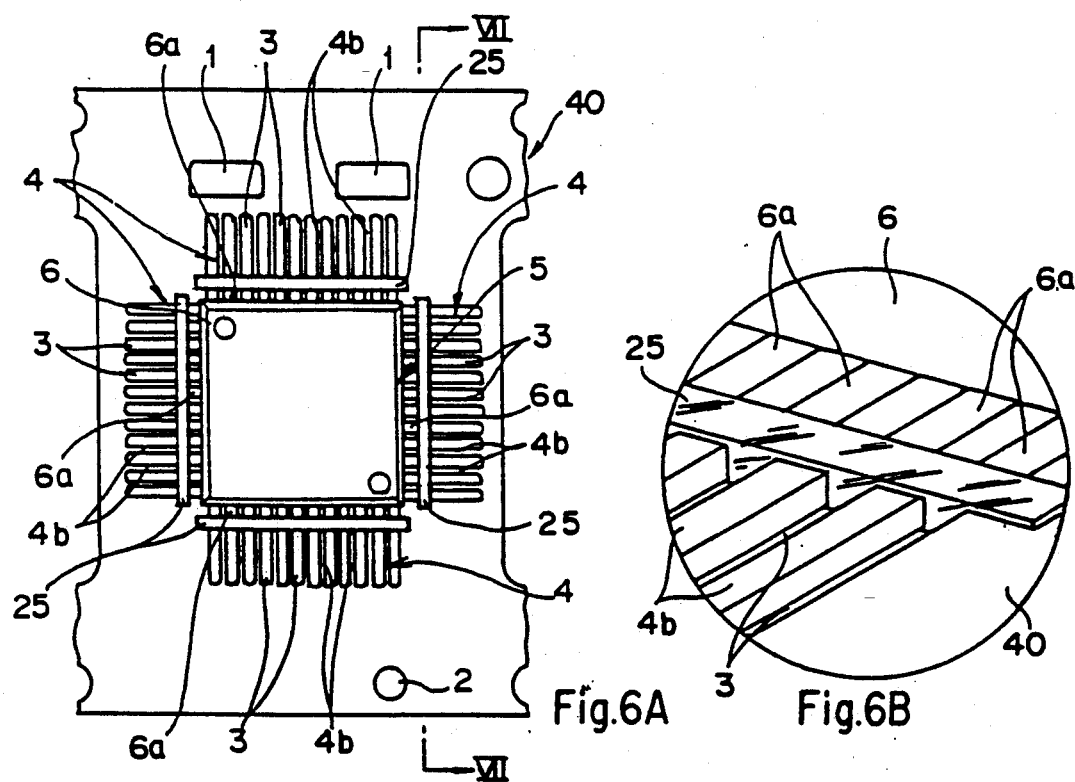
FIG. 6A is a plane view of a semiconductor device showing another example which applies this invention to QFP.
Figure 6B:
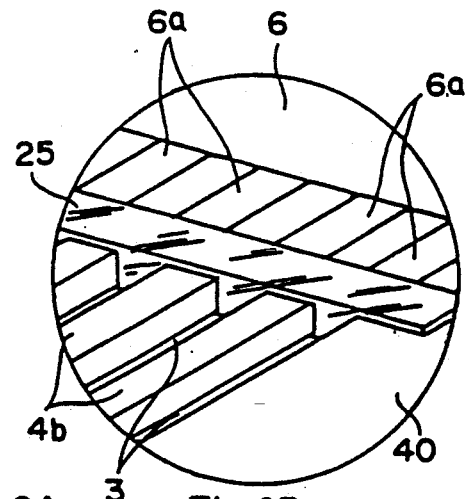
FIG. 6B is an enlarged perspective view of a portion of the semiconductor device shown in FIG. 6A.
Figure 7:
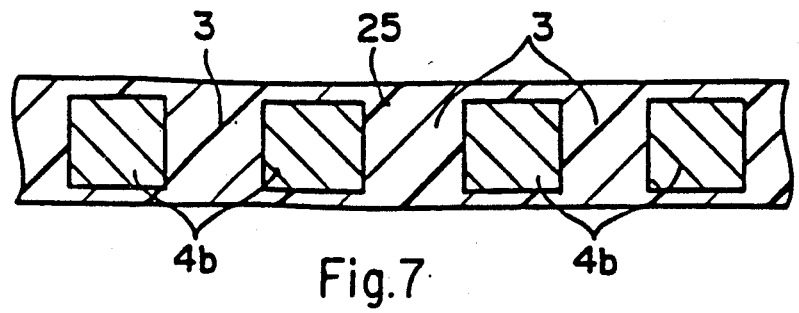

In other words, as shown in FIGS. 6B and 7, the spaces 3 between the adjacent outer leads 4b are filled by photoresist 25 in the predetermined areas of the outer leads 4b to connect the adjacent outer leads (in this example, the same areas as dam bars 4c in FIGS. 15 and 16). And as described above, areas other than the outer leads 4b and the photoresist 25 are resin-sealed with the mold resin 6. In this example, furthermore, the photoresist 25 is also, as shown in FIG. 7, thinly formed on the upper and lower surfaces of the outer leads 4b, and each portion of photoresist 25 embedded in the spaces 3 between the outer leads 4b is also connected with other through the thin photoresist on the leads 4b.

In the semiconductor device in accordance with this example, as described above, the spaces 3 between the outer leads 4b adjoining in the direction of arrangement of the outer leads 4b are connected by the photoresist 25 for preventing the outflow of sealing resin, which has a predetermined width and is locally provided only in areas with said predetermined width along said direction of arrangement, and areas other than the outer leads 4b and the photoresist 25 are resin-sealed. In the same way as the foregoing example, consequently, it is not necessary to have a cutting process as in case of the dam bars 4c which are formed on the conventional lead frame 40. As a result, said semiconductor device has the same advantages as the preceding example and, in case of this example, the amount of resin filled in the spaces 3 between the outer leads 4b can be readily increased because it is single-layered with the photoresist 25 alone. In this example, in addition, the photoresist 25 is formed on the upper and lower surfaces of the respective outer leads 4b, thus forming a continuous layer and connecting the adjacent outer leads 4b. As a consequence, the outer leads 4b can resist more effectively the pressure of the mold resin 6 in molding. Furthermore, use of the photoresist assures the maintenance of the shape as the dam bars, coupled with their sufficient heat resistance because of the nature as photoresist used for solder resist.

Next, principal methods for manufacturing the semiconductor device in accordance with this embodiment will be described with reference to FIGS. 8 and 9.

Figure 8:
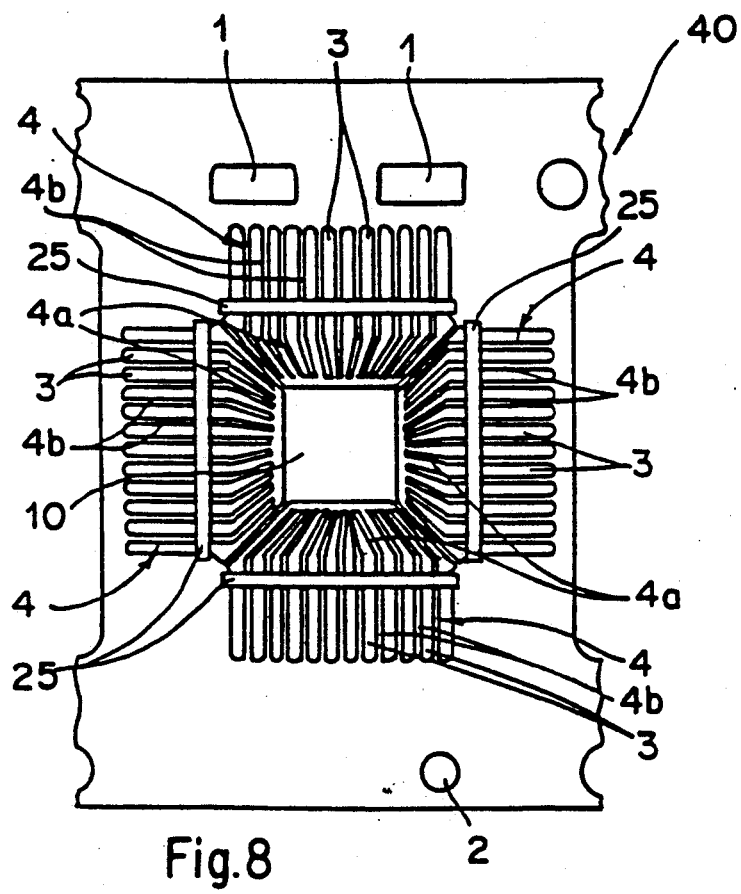

First of all, as shown in FIG. 8, in a state before the above described IC chip 7 is mounted on the mount portion 10, the predetermined areas of the outer leads 4b (which, in this example, are the corresponding areas to the dam bars 4c in the above-mentioned prior art of FIGS. 15 and 16) and a predetermined photoresist, a so-called dry film photoresist (which is generally used as a protective film coating the patterns formed on both-side layers of a printed circuit board and thereby protecting it from physical and chemical damages) are laminated (heat pressured) on each other. In this case, said dry film photoresist usually has a three-layer structure with the photoresist 25 sandwiched by carrier film (not shown) and cover (protection) film (not shown), with which the lamination is performed by using a device called laminator.

Figure 9A:
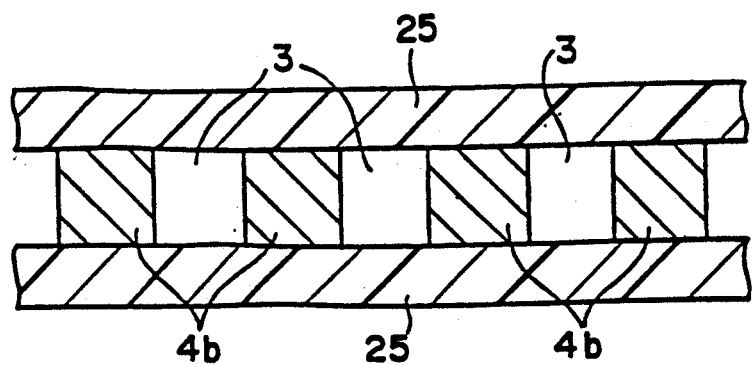
FIGS. 9A, 9B, 9C, 9D and 9E, respectively, are cross sectional views and diagonal views of main parts showing successively the major steps of a method for manufacturing the semiconductor device in the example of FIG. 6 (FIGS. 9A and 9B are cross sectional views of main parts, and FIGS. 9C, 9D and 9E are diagonal views of main parts).
Figure 9B:
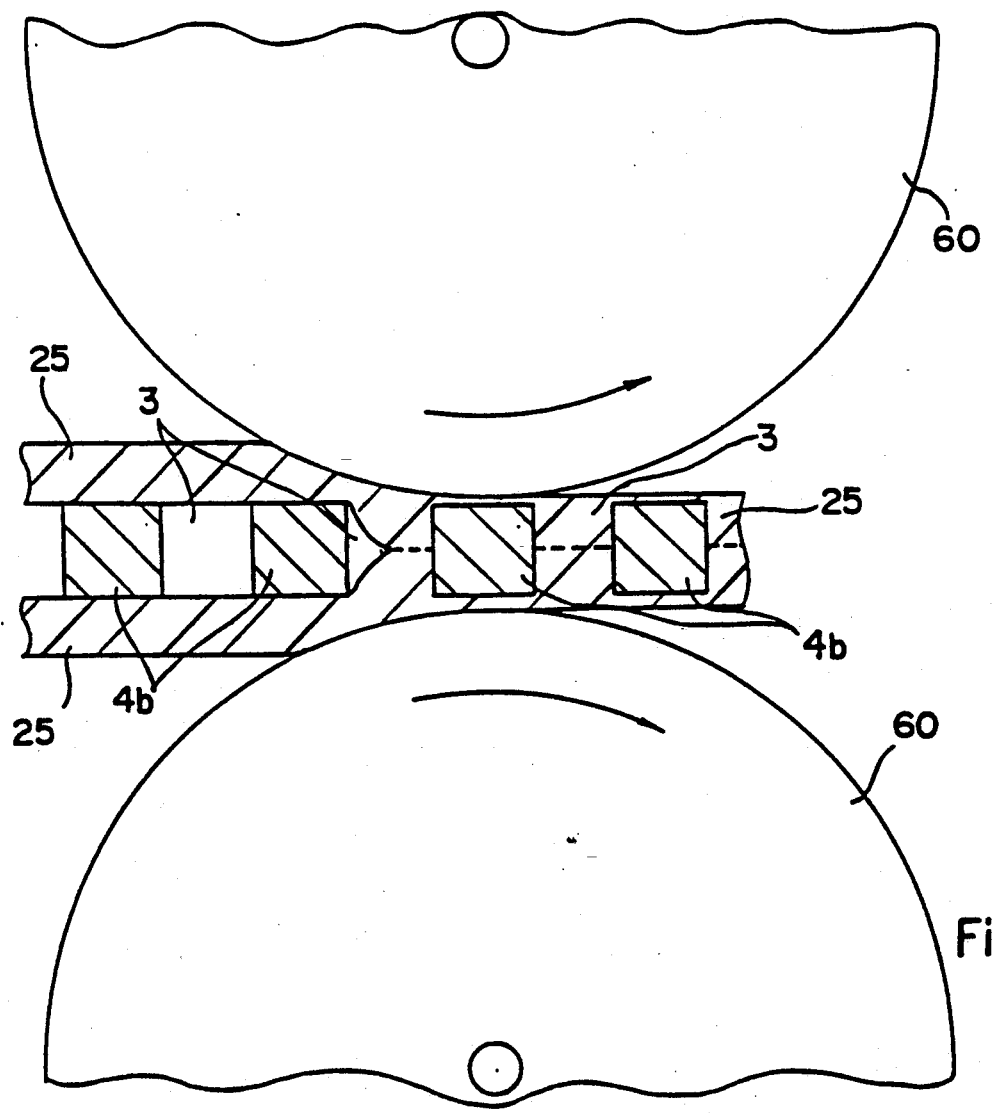

While detailed description of laminating process is omitted here, it is mainly constituted as follows: as shown in FIG. 9A, the above-mentioned dry film in a state with the cover film removed is sticked on the predetermined areas of the outer leads 4b from both upper and lower surfaces; and, as shown in FIG. 9B, said areas are laminated by a pair of lamination rolls 60 while the carrier film of said dry film is being rolled round a winding roll (not shown) (see FIG. 9C). That is to say, as shown in the drawing, with the photoresist 25 embedded in the spaces 3 between the adjacent outer leads 4b, the respective outer leads 4b are connected.

Figure 9C:
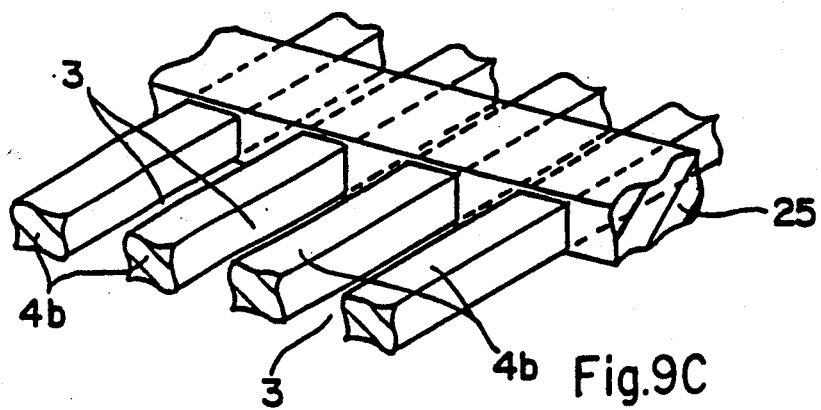
Figure 9D:
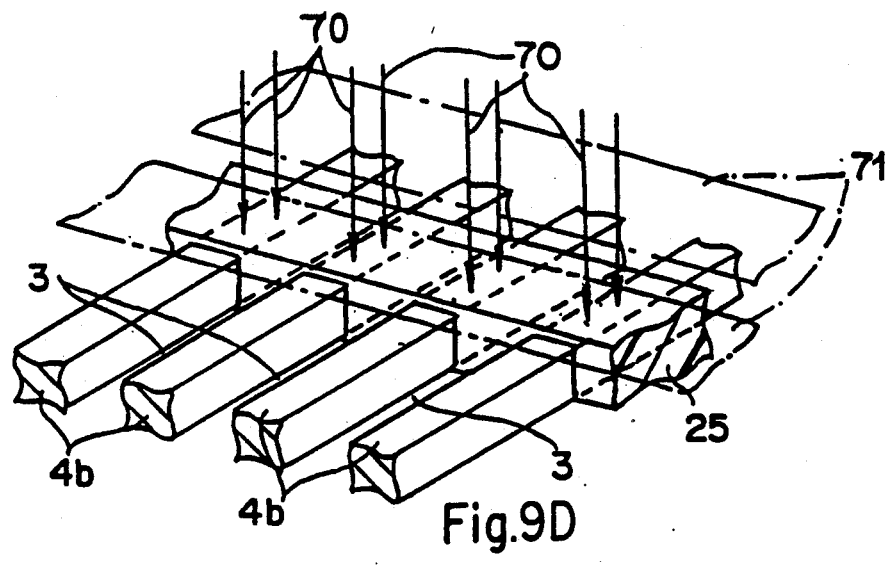
Figure 9E:
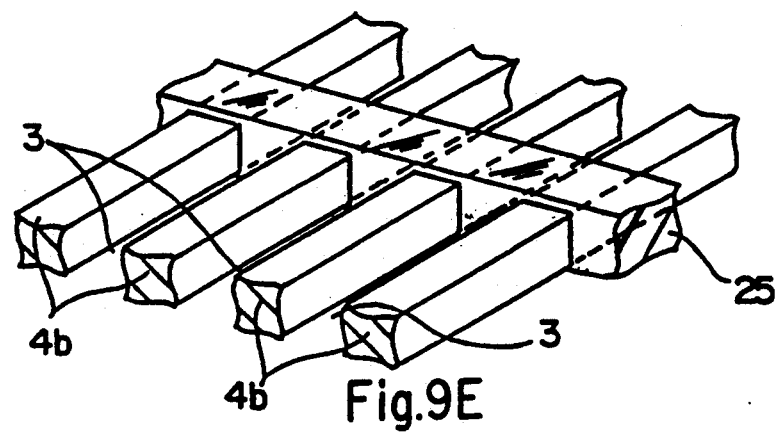

Next, FIGS. 9C to 9E are diagonal views of the main parts of the outer leads 4b in FIG. 8. Exposure process of the photoresist 25 laminated in these drawings will be described. That is to day, going through the aforementioned process leads to lamination of the photoresist 25 over the predetermined areas of the outer leads 4b as shown in FIG. 9C and, as shown in FIG. 9D, areas other than those where resin dam bars 25 should be formed are covered with photomask 71 and then printed with ultraviolet light 70 (namely, the photoresist 25 of this example is a negative type, so that only those areas exposed to the ultraviolet light 70 become insoluble to a developer due to photopolymerization). As shown in FIG. 9E, moreover, with etching performed with the predetermined developer, only the photoresist 25 is left in the predetermined areas. Although no subsequent steps are shown by drawings, the photoresist 25 is further ultraviolet-hardened with the prescribed ultraviolet light.

As shown in FIG. 8, after the IC chip is mounted on the mount portion 10 in the lead frame 40 which has the resin dam bars 25 formed in the predetermined areas of the outer leads 4b, the predetermined wire bounding is provided to said IC chip and, moreover, areas other than the outer leads 4b are resin-sealed, so that the semiconductor device shown in FIG. 6A is completed.

As also revealed by the above described method for manufacturing a semiconductor device, in accordance with a semiconductor device and a method for manufacturing the same in this example, there are three processes involved; as shown in FIG. 9A, the photoresist 25 with a predetermined width is locally provided only in areas with said predetermined width along the direction of arrangement of the outer leads 4b; as shown in FIGS. 9B to 9E, the photoresist 25 is processed (lamination and exposure) to connect the spaces 3 between the adjacent outer leads 4b; and areas other than the outer leads 4b are resin-sealed while the outflow of sealing resin is prevented by the photoresist 25. As a consequence, in the same manner as the preceding example, there is no need for cutting process like in case of the conventional dam bars. And in this example a highly reliable semiconductor device having the same advantages as the above-mentioned example can be provided due to the above described dry film which is commonly used.

In case of this example, the aforementioned resin dam bars 25 can be formed before resin-sealing (for example, they can be readily produced in advance on the part of a maker who produces the lead frame), thus leading to a great convenience in terms of mass production.

FIGS. 10 to 14 show still another embodiment of this invention.

Since the basic structure of a semiconductor device in accordance with this embodiment is approximately same as the prior art in FIGS. 15 and 16, description is omitted by putting the same numerals for the sake of convenience in explanation. However, a difference lies in the resin dam bars which are provided, as shown by an enlarged diagonal view in FIG. 10B, by using a sheet-like material called prepreg.

Figure 11A:
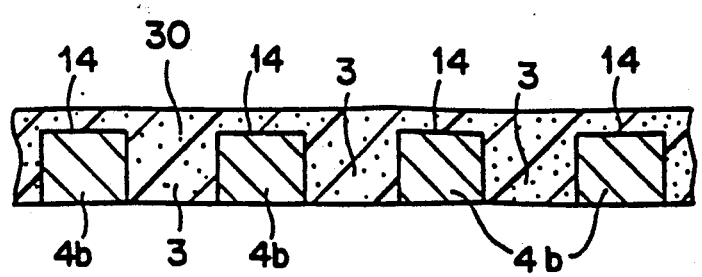
FIGS. 11A and 11B, respectively, are sectional views along the lines XIA—XIA and XIB—XIB in FIG. 10A.
Figure 11B:
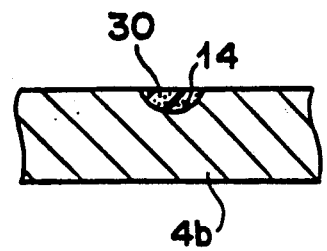

In other words, as shown in FIGS. 11A and 11B, the spaces 3 between outer leads 4b adjoining in the predetermined areas of the outer leads 4b (in this example, the same areas as the dam bars in FIGS. 15 and 16) are connected by prepreg 30 (prepreg; a sheet material obtained by allowing carbon fiber such as glass fabric to be impregnated with expoxy resin or the like and then hardened up to B-stage [a semi-hardened state]; for example, YEF-040, manufactured by Mitsubishi Petrochemical Co., Ltd., is used in this example). That is to say, in this example, as shown in FIGS. 12 and 13, approximately semi-cylindrical notches 14 (which can be formed by an ordinary ethcing technique) are provided on the surface in the above-mentioned predetermined areas of the outer leads 4b, and the prepreg 30 is embedded in said notches and the spaces 3 between the adjacent outer leads 4b, thereby connecting the respective adjacent outer leads 4b.

In the semiconductor device in accordance with this embodiment, as described above, the spaces 3 between the outer leads 4b adjoining in the direction of arrangement of the outer leads 4b are connected by the prepreg 30 for preventing the outflow of sealing resin, which has a predetermined width and is locally provided only in areas with said predetermined width along said direction of arrangement, and areas other than the outer leads 4b and the prepreg 30 (in this example, other than the outer leads 4b side and the resin dam bars 30 formed in the outer leads 4b) are resin-sealed, so that there is no need for cutting as in case of the conventional dam bars which are formed on the lead frame. Therefore, said semiconductor sevice has the same advantages as the preceding example. Moreover, sincew the mechanically and thermally stable prepreg 30 is used, the structure of the outer leads 4b connected by the prepreg 30 becomes stable. In addition, with the notches 14 provided in the outer leads 4b; the respective adjacent outer leads 4b are connected with each other by the continuous prepreg 30 embedded in said spaces 3, thus enabling the outer leads 4b to resist the pressure of mold resin effectively at the time of molding.

In the next, a method for manufacturing a semiconductor device in accordance with this embodiment will be described with reference to FIGS. 12 to 14.

Figure 12:
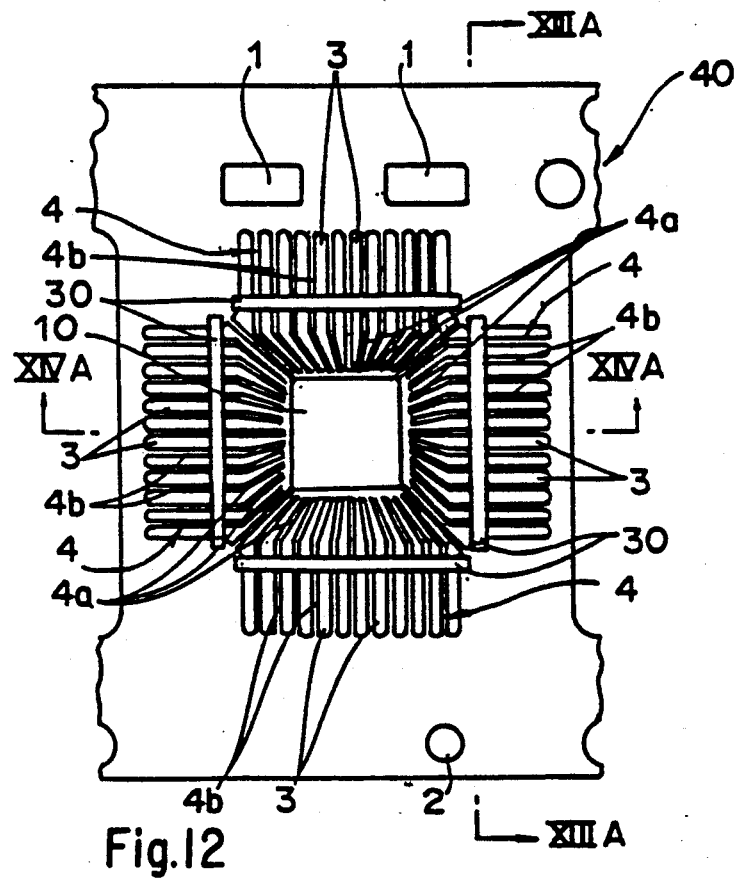
Figure 13A:
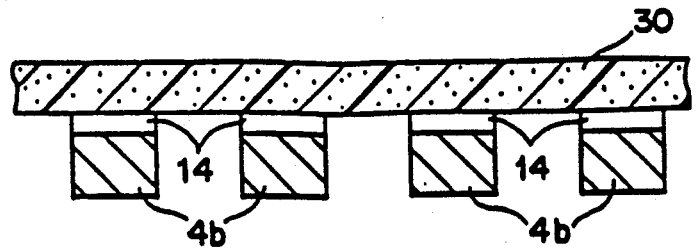
FIGS. 13A and 13B, respectively, are sectional views (the sectional views along the line XIII—XIII in FIG. 12) showing the principal steps of a method for manufacturing the semiconductor device in the example of FIG. 10A.
Figure 13B:
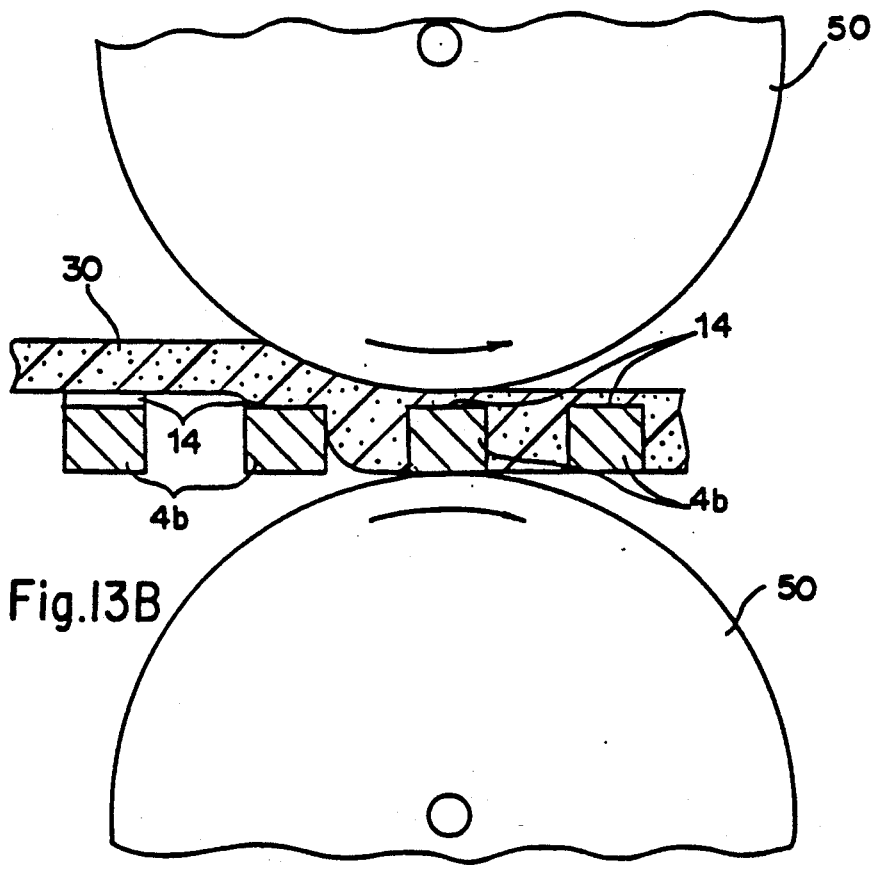
Figure 14A:
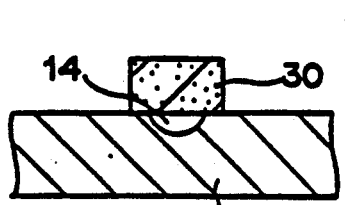
FIGS. 14A and 14B, respectively, are sectional views (the sectional views along the line XIV—XIV in FIG. 12) showing the principal steps of a method for manufacturing the semiconductor device in the example of FIG. 10A.
Figure 14B:
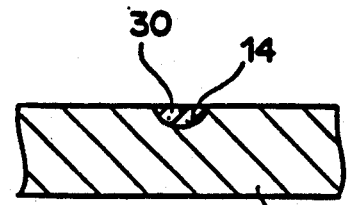

First, as shown in FIG. 12, before the above-mentioned IC chip 7 is mounted on the mount portion 10, predetermined prepreg pieces 30 are placed in the predetermined areas of the outer leads 4b (in this example, the same areas as the dam bars 4c in the prior art of FIGS. 15 and 16) (see FIGS. 13A and 14A). At this time the prepreg pieces 30 are in a semi-hardened state (B stage) with some viscosity, and with the outer leads 4b (for example, Cu) surrounded, the constituents of the prepreg pieces 30 further react or are cross linked to maintain the position of the outer leads 4b. The spaces 3 between the adjacent outer leads 4b are, as shown in FIGS. 11A and 11B, connected as the resin dam bars 30 by way of a pair of heat rollers 50 (with a temperature of, for example, 250° C.) as shown in FIGS. 13B and 14B. In other words, since the prepreg 30 has a thermosetting property, as shown in FIG. 13B, it is temporarily given fluidity almost like a liquid due to heat press by the heat rollers 50 and is filled in the spaces 3 between the outer leads 4b and the notches 14, then hardening completely as shown in FIG. 11.

Thereafter, a semiconductor device shown in FIG. 10A is completed by mounting the IC chip 7 on the mount portion 10, performing ordinary wire bonding and then resin sealing.

As also revealed by the above described method for manufacturing a semiconductor device, a semiconductor device and a method for manufacturing the same in accordance with this embodiment possess the following processes; the prepreg 30 with a predetermined width is locally provided only in areas with said predetermined width along the direction of arrangement of the outer leads 4b (FIGS. 13A and 14A); the prepreg 30 is embedded in the spaces 3 between the adjacent outer leads 4b for their connection (see FIGS. 13B and 14B); areas other than the outer leads 4b are resin-sealed while the outflow of sealing resin is prevented by prepreg 30. As a result, there is no need for the process of cutting the conventional dam bars, like in the preceding example, and the device has the same advantages as the above-mentioned example.

Likewise in this example, moreover, the above-mentioned resin dam bars 30 may be formed before resin-sealing (for example, they may be readily produced on the part of a maker who produces the lead frame), thus bringing about a great convenience in terms of their mass production.

It will be evident that various modifications may be made to the described embodiments without deoparting from the scope of the present invention.

For example, the resin tape 20 for preventing the outflow of sealing resin is directly provided in the predetermined areas of the outer leads 4b in the preceding example, but the resin tape 20 may be provided in the mold 11 for molding (for example, the lower mold 11b), resulting in improvement of workability. In addition, only an adhesive 20a is embedded in the spaces 3 between the outer leads 4b by using a double-sided tape or the like as the resin tape 20, thus enabling the amount of filling to be increased.

In the preceding embodiment, the resin tape 20 is provided only on the one-side surfaces of the predetermined areas of the outer leads 4b (see FIG. 4A). However, said resin tape 20 may be provided on both-side surfaces in correspondence with the pitches of the outer leads 4b (that is, in correspondence with the spaces between the respective outer leads 4b). Moreover, material and layer constitution as a resin material for preventing the outflow of the above-mentioned sealing resin may be changed properly.

In the embodiment of FIGS. 10 to 14, furthermore, the areas where the notches 14 are provided may be varied in addition to the changes in the shape, number, etc. of the notches 14 as provided in the outer leads 4b. The notches 14 may be applied to, for example, the embodiment of FIGS. 1 to 5. In addition, in the embodiments of FIGS. 6 to 9 and FIGS. 10 to 14, respectively, the resin dam bars are provided in the same areas as the tie bars 4c in the prior are of FIGS. 15 and 16. In this case, the place of their formation may be set to the very limit of the position of the mold line, thus enabling the elimination of the outflow portion 6a of the above-mentioned extra mold resin.

In the embodiments of FIGS. 1 to 5 and FIGS. 10 to 14, respectively, moreover, the pieces of the resin material (the resin tape 20 or the prepreg 30) for preventing the outflow of sealing resin, which are formed in the spaces 3 between the respective adjacent outer leads 4b, are continuously provided. However, it is not always necessary to form the foregoing pieces continuously, but the adjacent outer leads 4b may be connected by the resin material in the spaces 3 used for preventing the outflow of sealing resin. Other than the resin material, it is possible to use an electrically insulating material.

Each of the above described embodiments covers an application of this invention to a flat-pack type semiconductor device, but it may be applied to, for example, a DIP (Dual In-Line Package) type semiconductor device and other various ones. Moreover, this invention may also be applied to, for example, a semiconductor device of TAB system with polyimide base or the like sticked under the leads 4 in the example of FIG. 1.

In accordance with this invention, as described above, after an insulating material with a predetermined width is locally provided only in areas with said predetermined width along the direction of arrangement of the outer leads, said outer leads adjoining to each other are connected and, moreover, areas other than said outer leads and said insulating material are resin-sealed while preventing the outflow of sealing resin by said insulating material. Consequently, inconvenience in the conventional tie bars may be removed, and only application of a known processing technique to said insulating material may lead to ready prevention of sealing resin outflow through an ordinary process without adding any special step. As a result, this invention enables to provide a highly reliable semiconductor device which may readily acheive the desired pitches of leads (outer leads).

What is claimed is:
1. A semiconductor device package comprising:
   a patterned lead frame of an electrically conductive material including a plurality of electrically conductive leads having inner lead portions and outer lead portions;
   a semiconductor chip mounted to said patterned lead frame in proximity to said inner lead portions;
   electrically conductive connector wires extending between said semiconductor chip and at least some of said inner lead portions and connecting said semiconductor chip to said at least some of said inner lead portions;
   a nonconductive material locally embedding predetermined areas of the adjacent outer lead portions and filling the spaces therebetween;
   each of said outer lead portions having a terminal end extending outwardly from the predetermined area thereof as locally embedded by said nonconductive material;
   said locally embedding nonconductive material comprising a flexible nonconductive tape adhesively secured to said lead frame, said flexible nonconductive tape overlying said predetermined areas of said outer lead portions of said lead frame and having a width dimension terminating short of the outer terminal ends thereof, said flexible nonconductive tape having tape portions embedded in the spaces between adjacent outer lead portions in the predetermined areas thereof;
   a molded mass of nonconductive material encapsulating said semiconductor chip, said connector wires and portions of said plurality of electrically conductive leads other than said outer lead portions; and
   said tape portions of said flexible nonconductive tape embedded in the spaces between adjacent outer lead portions blocking the outflow of the encapsulating molded mass of nonconductive material along the spaces between adjacent outer lead portions to ensure hermetic sealing by the molded mass of nonconductive material with respect to the semiconductor chip, said connector wires, and the plurality of electrically conductive leads of said lead frame with the terminal ends of said outer lead portions extending outwardly thereof.

2. A semiconductor device package as set forth in claim 1, wherein said flexible nonconductive tape is a composite tape comprising a base layer of a nonconductive film and a layer of adhesive material contiguous to the base layer of nonconductive film and joined thereto along its extent;

the tape portions embedded in the spaces between adjacent outer lead portions in the predetermined areas thereof including portions of the layer of adhesive material; and said portions of the layer of adhesive material being in engagement with the sides of said adjacent outer lead portions.

3. A semiconductor device package as set forth in claim 2, wherein the composite tape locally embedding said predetermined areas of the adjacent outer lead portions defines elongated bars of nonconductive material arranged on opposite sides of said semiconductor chip in outwardly spaced relation with respect thereto.

4. A semiconductor device package as set forth in claim 1, wherein said flexible nonconductive tape locally embedding said predetermined areas of the adjacent outer lead portions defines elongated bars of nonconductive material arranged on opposite sides of said semiconductor chip in outwardly spaced relation with respect thereto.

5. A semiconductor device package comprising:

a patterned lead frame of an electrically conductive material including a plurality of electrically conductive leads having inner lead portions and outer lead portions;

a semiconductor chip mounted to said patterned lead frame in proximity to said inner lead portions;

electrically conductive connector wires extending between said semiconductor chip and at least some of said inner lead portions and connecting said semiconductor chip to said at least some of said inner lead portions;

a nonconductive photoresist material locally embedding predetermined areas of the adjacent outer lead portions and filling the spaces therebetween, said nonconductive photoresist material including relatively thin photoresist layers disposed on upper and lower surfaces of the locally embedded predetermined areas of the adjacent outer lead portions and integral with the locally embedded nonconductive photoresist material filling the spaces between the adjacent outer lead portions;

each of said outer lead portions having a terminal end extending outwardly from the predetermined area thereof as locally embedded by said nonconductive photoresist material;

a molded mass of nonconductive material encapsulating said semiconductor chip, said connector wires and portions of said plurality of electrically conductive leads other than said outer lead portions; and said locally embedding nonconductive photoresist material embedded in the spaces between adjacent outer lead portions blocking the outflow of the encapsulating molded mass of nonconductive material along the spaces between adjacent outer lead portions to ensure hermetic sealing by the molded mass of nonconductive material with respect to the semiconductor chip, said connector wires, and the plurality of electrically conductive leads of said lead frame with the terminal ends of said outer lead portions extending outwardly thereof.

6. A semiconductor device package as set forth in claim 5, wherein said nonconductive photoresist material locally embedding said predetermined areas of the adjacent outer lead portions defines elongated bars of photoresist material respectively disposed about the periphery of said semiconductor chip in outwardly spaced relation with respect thereto.

7. A semiconductor device package comprising:

a patterend lead frame of an electrically conductive material including a plurality of electrically conductive leads having inner lead portions and outer lead portions;

a semiconductor chip mounted to said patterned lead frame in proximity to said inner lead portions;

electrically conductive connector wires extending between said semiconductor chip and at least some of said inner lead portions and connecting said semiconductor chip to said at least some of said inner lead portions;

a nonconductive prepreg material locally embedding predetermined areas of the adjacent outer lead portions and filling the spaces therebetween;

each of said outer lead portions being provided with notches in the surfaces thereof located at said predetermined areas thereon, said nonconductive prepreg material being embedded in the notches formed in said predetermined areas of said outer lead portions;

each of said outer lead portions having a terminal end extending outwardly from the predetermined area thereof as locally embedded by said nonconductive prepreg material;

a molded mass of nonconductive material encapsulating said semiconductor chip, said connector wires and portions of said plurality of electrically conductive leads other than said outer lead portions; and said locally embedding nonconductive prepreg material embedded in the spaces between adjacent outer lead portions blocking the outflow of the encapsulating molded mass of nonconductive material along the spaces between adjacent outer lead portions to ensure hermetic sealing by the molded mass of nonconductive material with respect to the semiconductor chip, said connector wires, and the plurality of electrically conductive leads of said lead frame with the terminal ends of said outer lead portions extending outwardly thereof.

8. A semiconductor device package as set forth in claim 7, wherein said nonconductive prepreg material locally embedding said predetermined areas of the adjacent outer lead portions defines elongated bars of prepreg material respectively disposed about the periphery of said semiconductor chip in outwardly spaced relation with respect thereto.

* * * * *